(12) United States Patent
Marinaro et al.

(10) Patent No.: US 6,245,584 B1
(45) Date of Patent: *Jun. 12, 2001

(54) METHOD FOR DETECTING ADJUSTMENT ERROR IN PHOTOLITHOGRAPHIC STEPPING PRINTER

(75) Inventors: Vincent Marinaro, Sunnyvale; Eric Kent, San Jose, both of CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/346,632

(22) Filed: Jul. 1, 1999

(51) Int. Cl.$^7$ ...................................... H01L 21/66
(52) U.S. Cl. ........................... 438/14; 382/144; 382/145; 382/149; 382/151; 430/30
(58) Field of Search ............................... 438/14; 382/144, 382/145, 149, 151; 430/30

(56) References Cited

U.S. PATENT DOCUMENTS 5,906,902 * 5/1999 Farrow .................................. 430/30
6,051,348 * 4/2000 Marinaro et al. ...................... 430/30

* cited by examiner

*Primary Examiner*—John F. Niebling
*Assistant Examiner*—Olivia Luk
(74) *Attorney, Agent, or Firm*—David G. Alexander; Arter & Hadden

(57) ABSTRACT

An adjustment error in a photolithographic stepping printer is detected by applying photoresist to a semiconductor wafer, and exposing the wafer to substantially identical light images in multiple locations using a stepping printer. The light images are defined by an optical reticle and include a plurality of lines or other features that are spaced from each other at approximately the resolution limit of the printer. Developer (16) is applied to the wafer to produce visible images corresponding to the light images. The visible images function as diffraction gratings which reflect light from the wafer. The visible images are inspected optoelectronically or manually. An adjustment error is determined to exist if the visible images appear substantially identical but are uneven or otherwise abnormal.

13 Claims, 4 Drawing Sheets

METHOD FOR DETECTING ADJUSTMENT ERROR IN PHOTOLITHOGRAPHIC STEPPING PRINTER

BACKGROUND OF THE INVENTION

1. Field of the Invention

The present invention generally relates to the art of microelectronic integrated circuit fabrication, and more specifically to a method for detecting an adjustment error in a photolithographic stepping printer.

2. Description of the Related Art

Photolithography is an important technique in the fabrication of microelectronic integrated circuits. An optical mask or reticle is prepared which defines a pattern for features that are to be formed by oxidation, deposition, ion implantation, etching, and other techniques. A photoresist layer is formed on a semiconductor wafer on which the features are to be formed. The photoresist layer is optically exposed through the mask or reticle and causes a chemical reaction in areas which are not covered by opaque areas of the mask. The wafer is then developed to selectively remove areas of the photoresist layer.

In a positive photoresist process, the developer dissolves areas of the photoresist layer that were subjected to the optical exposure, leaving the areas that were protected by the opaque areas of the mask on the surface of the wafer. In a negative photoresist process, the unexposed areas are selectively removed by the developer. The remaining areas of the photoresist shield the underlying areas of the wafer such that they are unaffected by subsequent processing steps, whereas the exposed areas of the wafer can be subjected to oxidation, etc.

Various techniques are available for photolithographic exposure, including contact printing in which the mask or reticle is in contact with the wafer surface, and proximity printing in which the mask is close to, but does not contact the surface. A third technique is projection printing, in which an image of the mask is focussed onto the wafer using an optical imaging system.

Projection printing is especially desirable in that it enables the mask or reticle to be made several times larger than the actual size of the features to be formed on the wafer, thereby increasing the resolution level of the mask. The image as projected onto the wafer is reduced in size by the optical system.

Due to the extremely small tolerances of the optical system, an entire wafer is not exposed at once during projection printing. Instead, adjacent portions of the wafer are exposed sequentially. A first portion of the wafer is exposed, and the optical system is moved to a next position by means of a motor drive, and the next portion of the wafer is exposed. A photolithographic projection printer of this type is called a "stepping printer", "stepping aligner", or simply "stepper" or "aligner".

A plurality of integrated circuit devices are conventionally formed on a single wafer. The wafer is then "diced", or cut into individual "dies" which each include a single device. The dies are then subjected to additional operations, and are packaged into individual integrated circuit chips.

The area of a wafer which is exposed at each step of a stepper is called a "field". For the fabrication of small scale integrated circuits, a field can define more than one device. A field can also define a single device or, for large scale integration, a portion of a single device.

Steppers of the type to which the present invention particularly relates are commercially available from ASML of Tempe, Ariz. These steppers typically have a field of 22×22 mm and a resolution limit of 0.2 to 0.3 microns. However, the present invention is not limited to any particular type of printer, but is also applicable to proximity printers, step and scan printers, and any other type of optical stepping projection apparatus.

Stepping printers or aligners for photolithography are subject to very close tolerances in order to resolve submicron features. The optical systems have a number of adjustments, including focus, tilt, field curvature, etc., which must be precisely maintained. If an adjustment is off even slightly, the exposure operation can be so defective that the partially formed devices on the wafer will be unacceptable for further processing.

Following development, an inspection, sometimes referred to as an "after-develop-inspection" or ADI, is performed. The purpose is to ensure that the exposure, baking, development and other steps performed so far have been performed correctly and to the specified tolerance. Mistakes or unacceptable process variations can still be corrected, since the resist process has not yet produced any changes (e.g. through an etch step) to the wafer itself. Thus, any inadequately processed wafers detected through the inspection (known as "rejects") can have their resist stripped and reworked.

The inspection can be performed manually or can be automated. Either way, various feature characteristics on the wafer are examined using an optical microscope, scanning electron microscope or optoelectronic imaging device. The characteristics include linewidth, spacing, contact dimensions and variations of linewidths over fields. Adjustment errors in the stepper including focus, tilt and field curvature will result in the characteristics being out of tolerance and are detected in the inspection.

The prior art inspection methods are complicated, time consuming, and require elaborate and expensive equipment. In addition, it is difficult to associate the raw data obtained from the inspection with particular adjustment errors in the stepper. In other words, it is difficult to determine the actual cause of an out of tolerance condition from the data itself.

As such, there exists a need in the art for a simple, fast and inexpensive method for detecting and determining the cause of an adjustment error in a photolithographic stepping printer or aligner.

SUMMARY OF THE INVENTION

The present invention provides a method for determining if a photolithographic stepping printer is properly adjusted, and if not the particular adjustment which has not been made properly. In one form of the invention, the inspection can be made by visually inspecting a wafer without the need for any optical or electronic equipment.

More specifically, an adjustment error in a photolithographic stepping printer is detected by applying photoresist to a semiconductor wafer, and exposing the wafer to substantially identical light images in multiple locations using a stepping printer. The light images are defined by an optical reticle and include a plurality of lines or other features that are spaced from each other at approximately the resolution limit of the printer.

Developer is applied to the wafer to produce visible images corresponding to the light images. The visible images function as diffraction gratings which reflect light from the wafer. The visible images are inspected optoelectronically or manually. An adjustment error is determined to exist if the visible images appear substantially identical but are uneven or otherwise abnormal.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
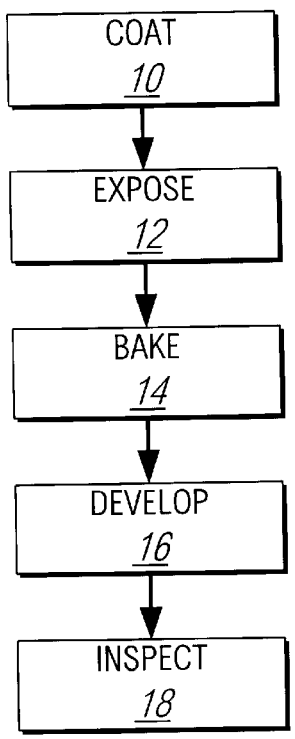
FIG. 1 is a block diagram illustrating the method steps and equipment used in photolithography.

FIG. 1 illustrates the basic steps and apparatus used in practicing the present invention. First, a semiconductor wafer is coated with photoresist as indicated at 10. The apparatus which performs the coating is typically a spin coater. The wafer is then optically exposed by a stepping printer or aligner as indicated at 12 to form a latent image in the photoresist by optochemical reaction. The wafer is then subjected to a post-exposure bake at 14, and developed at 16. As the result of the development, a physical pattern will be formed on the wafer consisting of photoresist areas that were not dissolved away by the developer. After development, the pattern is inspected at 18.

The units 10 to 16 illustrated in FIG. 1 can be separate, or two or more of them can be combined into a single apparatus. For example, the units 10, 14 and 16 can be combined into an apparatus called a "track".

Figure 2:
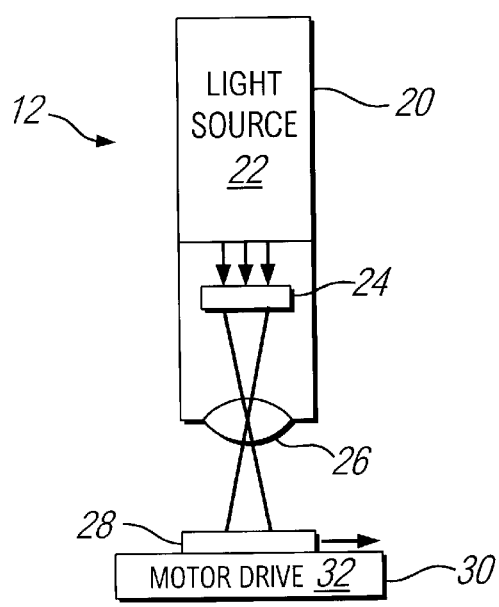
FIG. 2 is a simplified diagram illustrating a photolithographic stepping printer to which the present invention relates.

A simplified diagram of the stepping printer 12, also known as an aligner or stepper, is illustrated in FIG. 2. The printer 12 typically includes a housing 20 which contains a light source 22. A mask or reticle 24 is inserted between the light source 22 and an optical system 26 which is symbolically represented by a converging lens. The optical system 26 projects a focussed light image, typically reduced in size, of the reticle 24 onto a semiconductor wafer 28 which is mounted on a stage 30. A motor drive 32 moves the stage 30 and thereby the wafer 28 in a rectangular pattern relative to the optical system 26.

More specifically, the motor drive 32 moves the stage in a stepwise manner such that adjacent areas of the wafer 28 are exposed in sequence. At each step position, the wafer 28 is exposed to a field consisting of a light image of the reticle 24 having a size of typically 22×22 mm.

Figure 3:
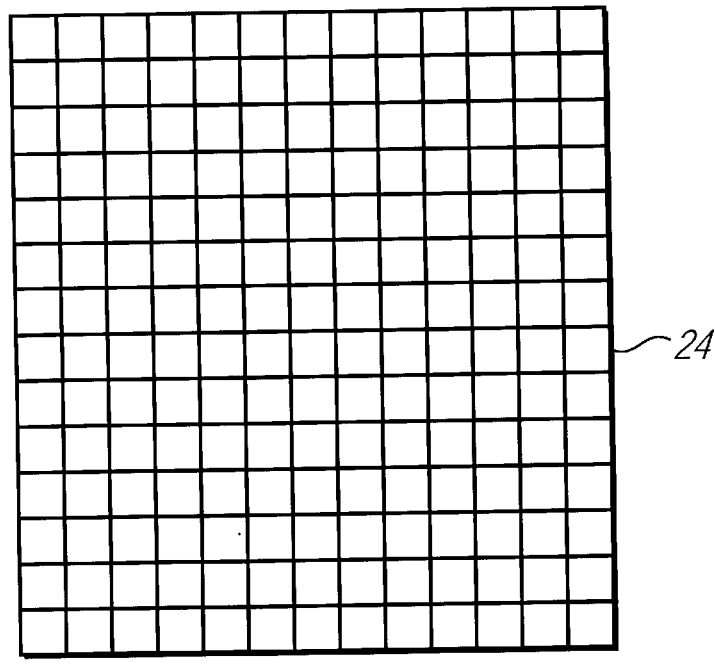
FIG. 3 is a simplified diagram illustrating a mask or reticle for the printer of FIG. 2.

FIG. 3 illustrates a reticle 24 for practicing the present invention. The reticle 24 is formed with a plurality features in the form of straight, parallel vertical and horizontal lines which are laterally spaced from each other at approximately the resolution limit of the printer 12. For current production ASML printers, for example, the spacing will be on the order of 0.2 to 0.3 microns.

Figure 4:
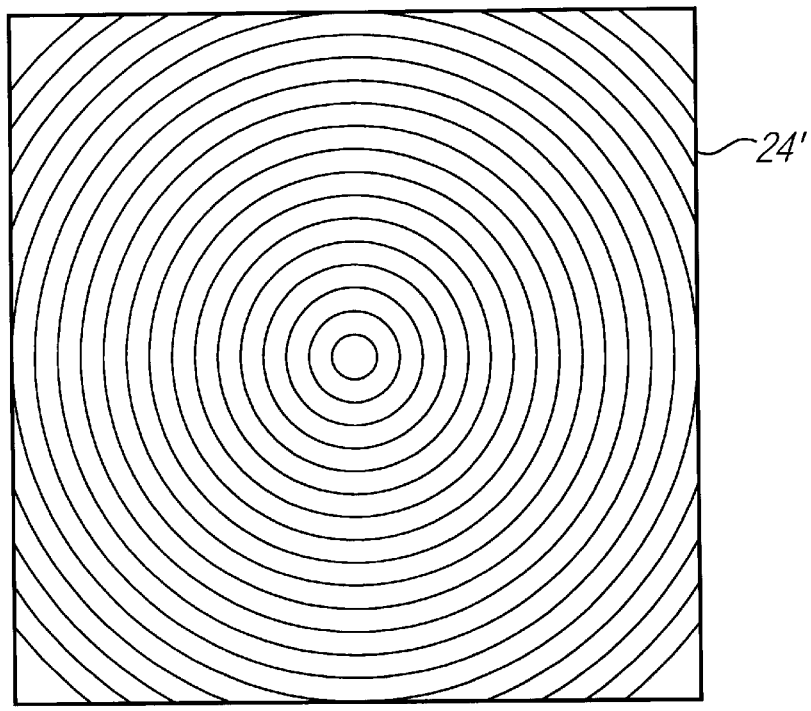
FIG. 4 is similar to FIG. 3 but illustrates another reticle.

FIG. 4 illustrates another reticle 24' which can be used to practice the present invention. The reticle 24' is formed with a plurality of concentric circles or circular lines which are radially spaced from each other by approximately the resolution limit of the printer 12. The invention is not limited to these two reticles, but can be practiced using a reticle formed with any other suitable pattern.

Figure 5:
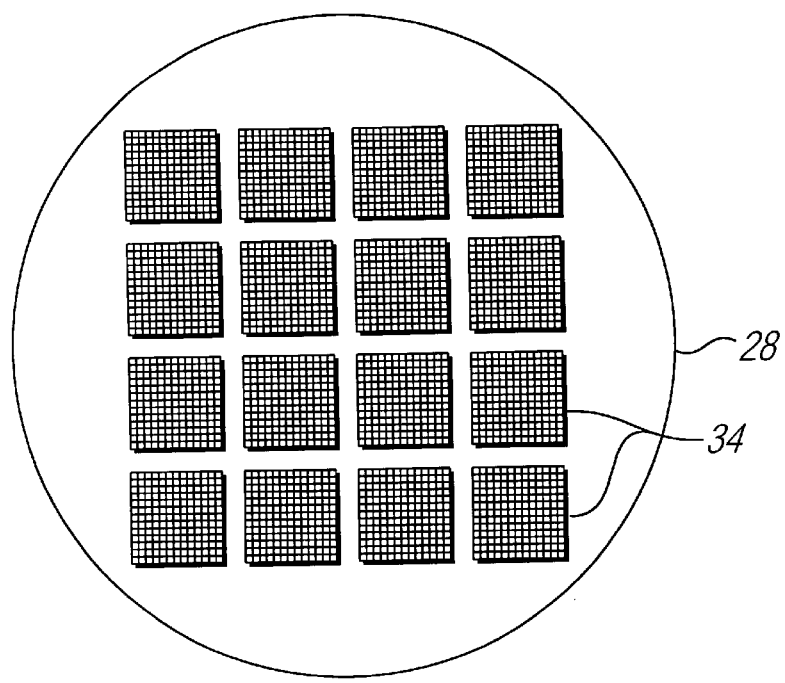
FIG. 5 illustrates a semiconductor wafer after being optically exposed with a plurality of fields and developed, in which the printer was adjusted properly.

In accordance with the present invention, the motor drive 32 of the printer 12 is used to step the wafer 28 relative to the optical system 26 and form latent images on the wafer 28 which are developed to produce visible images. FIG. 5 illustrates the wafer 28 after development with the printer 12 being properly adjusted. A plurality of identical visible images 34 are formed on the wafer 28, with the lines or other features in each image 34 being completely even.

The closely spaced features of the visible images 34 define diffraction gratings which appear colored when viewed by reflected light at a suitable angle. If the printer 12 is properly adjusted and no other problems with the other units illustrated in FIG. 1 exist, all of the images 34 will appear identical and of the same, even color. If there is an adjustment error with no problems in the other units, the images 34 will still appear identical but will be internally uneven or otherwise abnormal.

More specifically, an adjustment error will cause the images to have color gradients thereacross resulting from the uneven diffraction grating patterns of the visible images 34. The uneven patterns will cause reflected light to be diffracted differently, and changed in color.

Figure 6:
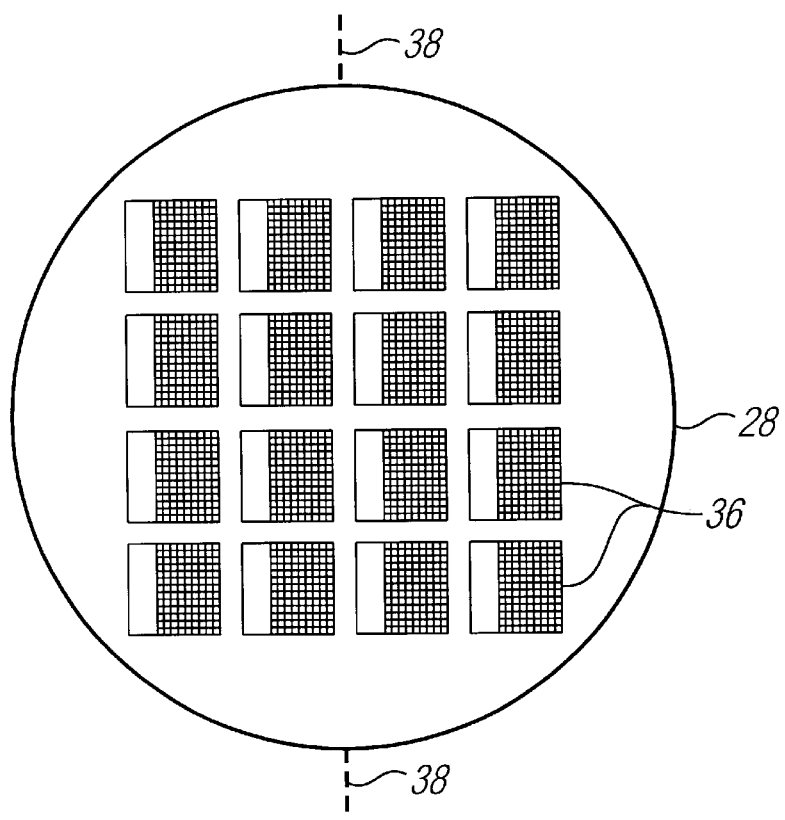
FIG. 6 is similar to FIG. 5 but illustrates a tilt adjustment error.

A particular adjustment error will produce a recognizable color gradient that is related to the type of error. For example, as illustrated in FIG. 6, a tilt adjustment error in the printer 12 will cause a lateral color gradient in the visible images as illustrated at 36. The drawing illustrates the case of a tilt error about a vertical axis 38, although a tilt error can occur about a horizontal or diagonal axis. The features in the images 36 are laterally uneven because part of the wafer 28, in the illustrated example the right sides of the images 36, are closer to the optical system 26 than the left sides and therefore out of focus. This causes the in-focus features to be more strongly defined than the out-of-focus features.

In one form of the invention, the wafer inspection 18 can be performed visually, without any equipment. The inspector holds the wafer 28 at a suitable angle at which diffraction of reflected light occurs, and analyzes the appearance of the visible images. If they are identical and even (e.g. no color gradient or other visible abnormality), the adjustments of the printer 12 are determined to be correct.

If the images are identical and uneven or otherwise abnormal, an adjustment error is determined to exist and the type of error is identified based on the visible appearance of the images. If the images are not identical, but have some global or local unevenness or other abnormality across the wafer, the cause is not an adjustment error in the printer 12, but is a problem in one of the other units illustrated in FIG. 1.

It is also within the scope of the present invention to automate the inspection process. The wafer 28 is oriented to cause diffraction of reflected light, and a digital image of the wafer is created using an optoelectronic scanner. The digital image is analyzed using automated pattern analysis. A programmed digital computer examines the areas of the digital image corresponding to the visible images on the wafer and compares the results with predetermined patterns using the same criteria described above.

Figure 7:
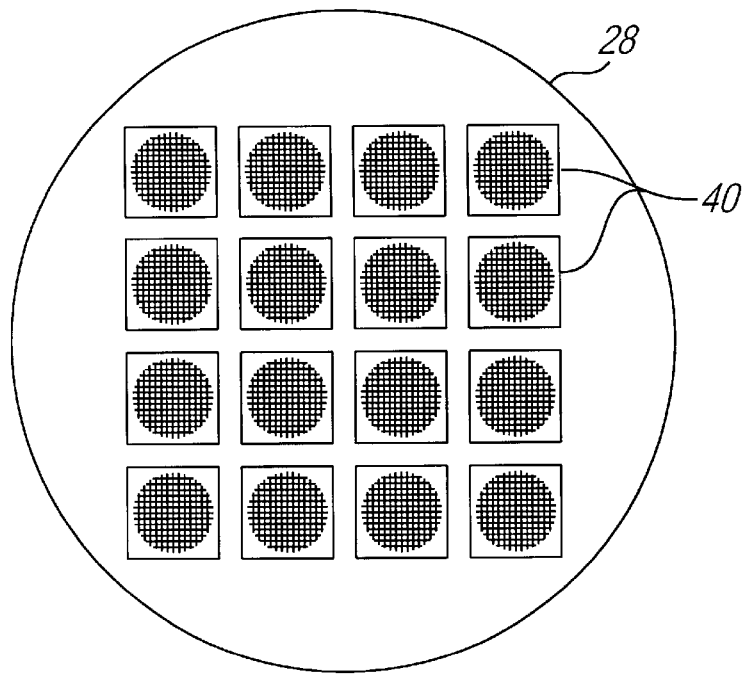
FIG. 7 is similar to FIG. 5 but illustrates a field curvature adjustment error.

FIG. 7 illustrates another exemplary pattern resulting from a field curvature adjustment error in the printer 12. In this case, visible images 40 are radially uneven because the centers of the images are a different distance (closer or farther) from the optical system 26 than the edges of the images. Again, the unevenness will appear as a color gradient or other visible characteristic.

Figure 8:
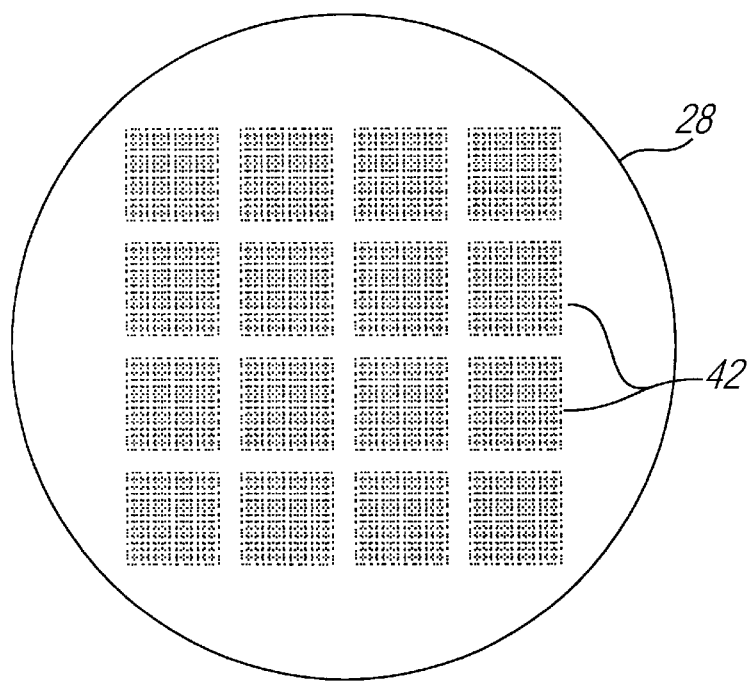
FIG. 8 is similar to FIG. 5 but illustrates a focus adjustment error.

FIG. 8 illustrates the appearance of a focus adjustment error. In this case, images 42 will be unclear because the features are out of focus, and the reflected light will have a different color from that of properly focussed images.

In general, a particular type of adjustment error will produce a particular visible color gradient or other pattern. These patterns can be identified, for example, empirically by deliberately producing known types of adjustment errors, exposing and developing wafers, and observing and cataloging the resulting appearance. This method can be used to determine patterns for visual or automated inspection. The patterns resulting from adjustment errors can also be derived from experience or identified in any other way.

It will be understood that the image patterns illustrated in FIGS. 6 to 8 are exemplary only, and are not limitative of the scope of the invention. These same types of adjustment errors can produce different patterns with other stepping printers. In addition, the present method can be used to identify other types of adjustment errors which produce other patterns. As yet another advantage of the present invention, wafers which are used to practice the invention can have the photoresist stripped therefrom and recycled.

In summary, the present invention provides a simple, fast and inexpensive method for detecting and determining the cause of an adjustment error in a photolithographic stepping printer or aligner.

Various modifications will become possible for those skilled in the art after receiving the teachings of the present disclosure without departing from the scope thereof.

What is claimed is:

1. A method for detecting an adjustment error in a photolithographic stepping printer, comprising the steps of:
    (a) applying photoresist to a semiconductor wafer;
    (b) exposing the wafer to substantially identical light images in multiple locations using a stepping printer, the light images including a plurality of features that are spaced from each other at approximately a resolution limit of the printer;
    (c) applying developer to the wafer to produce visible images corresponding to the light images;
    (d) inspecting the visible images using light reflected from the wafer; and
    (e) determining that an adjustment error exists if the visible images appear substantially identical but are abnormal.

2. A method as in claim 1, in which:
    step (d) comprises optoelectronically scanning the wafer to obtain an electronic image thereof; and
    step (e) comprises performing automated pattern analysis on the electronic image.

3. A method as in claim 1, further comprising the steps, performed before step (b), of:
    (f) providing a reticle for the printer having a pattern which creates the features of the light image; and
    (g) operatively inserting the reticle into the printer.

4. A method as in claim 3, in which step (f) comprises providing the reticle such that the pattern includes parallel lines.

5. A method as in claim 3, in which step (f) comprises providing the reticle such that the pattern includes straight parallel lines.

6. A method as in claim 3, in which step (f) comprises providing the reticle such that the pattern includes concentric circular lines.

7. A method as in claim 1, in which step (e) comprises determining that a tilt adjustment error exists if the images are axially uneven.

8. A method as in claim 1, in which step (e) comprises determining that a field curvature adjustment error exists if the images are radially uneven.

9. A method as in claim 1, in which step (e) comprises determining that a focus adjustment error exists if the images are unclear.

10. A method as in claim 1, further comprising the step, performed between steps (b) and (c), of:
    (f) performing post exposure baking of the wafer.

11. A method as in claim 1, wherein an adjustment error takes the form of color abnormalities in the reflected light.

12. A method as in claim 1, in which:
    step (e) comprises comparing color patterns in the reflected light with predetermined color patterns.

13. A method as in claim 12, in which the color patterns are color gradients.

* * * * *